United States Patent
Bash et al.

(10) Patent No.: US 7,549,298 B2
(45) Date of Patent: Jun. 23, 2009

(54) SPRAY COOLING WITH SPRAY DEFLECTION

(75) Inventors: Cullen E. Bash, San Francisco, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 265 days.

(21) Appl. No.: 11/005,284

(22) Filed: Dec. 4, 2004

(65) Prior Publication Data

US 2006/0117765 A1 Jun. 8, 2006

(51) Int. Cl.
*F25C 1/00* (2006.01)
(52) U.S. Cl. .................... 62/121; 62/259.2; 62/310
(58) Field of Classification Search .............. 62/121, 62/171, 259.2, 310
See application file for complete search history.

(56) References Cited

U.S. PATENT DOCUMENTS

| | | | | |
|---|---|---|---|---|
| 2,812,636 | A | * | 11/1957 | Kadosch et al. ........ 239/265.17 |
| 3,595,536 | A | * | 7/1971 | Ripley ................... 261/28 |
| 5,894,990 | A | | 4/1999 | Glezer et al. |
| 5,963,235 | A | | 10/1999 | Chwalek et al. |
| 6,012,805 | A | | 1/2000 | Hawkins et al. |
| 6,205,799 | B1 | | 3/2001 | Bash et al. |
| 6,217,163 | B1 | | 4/2001 | Anagnostopoulos et al. |
| 6,349,554 | B2 | | 2/2002 | Patel et al. |
| 6,457,321 | B1 | | 10/2002 | Patel et al. |
| 6,484,521 | B2 | | 11/2002 | Patel et al. |
| 6,508,532 | B1 | | 1/2003 | Hawkins et al. |
| 6,509,917 | B1 | | 1/2003 | Chwalek et al. |
| 6,550,263 | B2 | | 4/2003 | Patel et al. |
| 6,595,014 | B2 | | 7/2003 | Malone et al. |
| 6,604,370 | B2 | | 8/2003 | Bash et al. |
| 6,612,120 | B2 | * | 9/2003 | Patel et al. .................... 62/171 |
| 6,644,058 | B2 | | 11/2003 | Bash et al. |
| 6,708,515 | B2 | * | 3/2004 | Malone et al. ............. 62/259.2 |
| 6,817,196 | B2 | * | 11/2004 | Malone et al. ................ 62/171 |
| 6,817,204 | B2 | * | 11/2004 | Bash et al. .................... 62/304 |
| 2002/0085069 | A1 | | 7/2002 | Anagnostopoulos et al. |
| 2002/0085070 | A1 | | 7/2002 | Anagnostopoulos et al. |
| 2002/0085072 | A1 | | 7/2002 | Sharma et al. |
| 2002/0101486 | A1 | | 8/2002 | Anagnostopoulos et al. |
| 2002/0113840 | A1 | | 8/2002 | Trauernicht et al. |
| 2002/0113843 | A1 | | 8/2002 | Anagnostopoulos et al. |
| 2002/0113848 | A1 | | 8/2002 | Anagnostopoulos et al. |
| 2002/0135637 | A1 | | 9/2002 | Delametter et al. |
| 2002/0149654 | A1 | | 10/2002 | Anagnostopoulos et al. |
| 2003/0016272 | A1 | | 1/2003 | Anagnostopoulos et al. |
| 2003/0043223 | A1 | | 3/2003 | Delametter et al. |
| 2004/0118143 | A1 | | 6/2004 | Bash et al. |

FOREIGN PATENT DOCUMENTS

EP 0911168 6/2004

* cited by examiner

*Primary Examiner*—Melvin Jones

(57) ABSTRACT

A component cooling system including a sprayer configured to eject a stream of cooling fluid and a stream deflector to control deflection of the stream. The sprayer may be continuous or incremental. Excess spray may be deflected into a gutter configured to obstruct cooling fluid from striking the component. The stream deflector may operate using a contact surface, controllable orifice heaters, and/or electrodes is configured to deflect the stream in one or more degrees of freedom. Multiple sprayers may have overlapping spray patterns for redundancy.

38 Claims, 5 Drawing Sheets

SPRAY COOLING WITH SPRAY DEFLECTION

The present invention relates generally to cooling systems for heat-generating devices and, more particularly, to a spray cooling system and a method of using the spray cooling system to cool one or more semiconductor devices (i.e., chips).

BACKGROUND OF THE INVENTION

With the advent of semiconductor devices having increasingly large component densities, the removal of heat generated by the devices has become an increasingly challenging technical issue. Over time, the frequency of operation of CMOS devices has increased significantly. The resulting microprocessor power dissipation has likewise gone up by an order of magnitude. While the input voltage and capacitance of devices has decreased, the number of devices on a typical microprocessor die continues to increase rapidly as processing efficiency is sought. Moreover, device miniaturization has led device designers to integrate previously separate components, such as those used to create a cache, into the microprocessor die.

This consolidation of devices has resulted in high CPU core power density—e.g., 50% of a 20 mm by 20 mm microprocessor die may contain the CPU core, with the rest being cache. Furthermore, typical processor boards can, in some instances, include multiple CPU modules, application-specific integrated circuits (ICs), and static random access memory (SRAM), as well as a dc-dc converter, all of which have increasing power dissipation requirements, thereby increasing the total power dissipation level needed by computer systems.

Adding to the complexity, modern systems using such high-dissipation chips frequently have a variety of chips requiring different levels of cooling, only some of which are extreme. Depending on an electronic system's design, components containing these chips can be located throughout a system, and might not be easily dealt with using either simple cooling means, or using cost-efficient high-dissipation cooling means directed only to the chips requiring their capabilities.

Heat sinks can be used to increase the heat-dissipating surface area of heat-producing devices. However, heat sinks, are typically characterized by a mechanical interface to their cooled devices, which commonly leads to interference in the heat flow, and can lead to very high thermal resistance. Indeed, the bulk of the available thermal budget for cooling, typically a 45 degrees C. temperature differential between the chip temperature and the ambient temperature, will commonly be used up by this interface. The mechanical interface can also lead to uneven cooling. This is further complicated by the non-uniform power distribution on many chips, which often results when different components are integrated onto a single chip.

To deal with these difficulties, innovative ways have been developed to reduce chip-to-heat sink thermal resistance. Included among the cooling methods for semiconductors are free-flowing and forced-air convection, free-flowing and forced-liquid convection, pool boiling (i.e., boiling a liquid cooling fluid off of a submerged device), and spray cooling (i.e., boiling a liquid cooling fluid off of a device being sprayed with the liquid). Because liquids typically have a high latent heat of vaporization, these latter two methods provide for a high heat-transfer efficiency, absorbing a large quantity of heat at a constant temperature.

The use of these boiling/vaporizing methods is limited to a maximum power density, the critical heat flux (CHF). At higher densities, the vaporized cooling fluid forms a vapor barrier insulating the device from the liquid cooling fluid, thus allowing the wall temperature of the device to increase greatly. This phenomenon is referred to as dry-out. When a coolant is properly sprayed, it can disperse such a vapor layer, and its CHF can be well over an order of magnitude higher than the CHF of a pool-boiling system. This high CHF is preferably a uniform spray, and should match the power dissipation requirements of the device. Thus, spray cooling presently provides the most efficient cooling for a heat-generating device, such as a semiconductor device.

Typically, the cooling fluid used for spray cooling has a relatively low boiling point (in relation to the operating temperature of the device), which is the temperature that the sprayed device is cooled toward. Most preferably, the cooling fluid is inert to the heat source. For semiconductor devices, low boiling point fluids such as 3M® FC-72, (FC-72, i.e., FLUORINERT®, sold by 3M® Corporation), 3M's Novec line of fluids (HFE 7100, etc., sold by 3M® Corporation) or PF-5060 are among a number of known suitable cooling liquids.

The nozzle design is a key component of spray cooling. Pressure assisted and gas assisted nozzles are known designs where the cooling fluid is continuously sprayed. However, these types of nozzles are limited in their ability to control the rate at which they spray. Therefore, they can cause "pooling" (i.e., a buildup of liquid on the cooled device due to excessive spray rates). Also, a fine, localized control of the spray rate, direction and/or location is not generally available.

For pressure-assisted spraying, consistent, controlled spraying requires one or more high pressure pumps that provide a precise pressure to pump the liquid through a nozzle, even at varying flow rates. Both the distribution and the flow rate of the sprayed liquid can change with variations in the driving pressure and/or small variations in the nozzle construction. Thus, the cooling system is a sensitive and potentially expensive device that can be a challenge to control.

For gas atomizing, consistent, controlled spraying requires a pressurized gas that is delivered to a spray head design in a precise manner. Because the gas must be pressurized separately from the cooling fluid, such systems are not typically closed systems. The gas must be bled out for the condenser to run efficiently. Furthermore, both the distribution and the flow rate of the cooling fluid can change with variations in the gas pressure. Thus, the cooling system is a sensitive and potentially expensive device that can be a challenge to control.

Piezoelectric and thermal spray-jet nozzles are also known designs where the cooling fluid is incrementally sprayed (i.e., it is sprayed in increments on demand). While these types of nozzles typically provide superior control over the spray flow rate, it is possible that they might experience flow difficulties relating to their incremental spray mechanisms. Piezoelectric nozzles eject droplets of liquid from a chamber due a pressure wave within the chamber. The pressure wave is caused by the contraction of the chamber from an electrical charge applied to a piezoelectric device. Spray-jet nozzles use heaters to vaporize a small portion of a fluid in a chamber. The vaporized fluid expands, causing the remainder of the fluid to be ejected from the chamber.

A number of factors affect the performance of spray cooling, thus affecting the heat transfer coefficient h and/or the CHF. It is commonly understood that surface roughness and wettability of the sprayed component are two of these factors, and the orientation of the surface being sprayed can be a third. In particular, it is believed that h is higher for rough surfaces when using a pressurized liquid spray, and for smooth surfaces when using gas atomizing. Surfaces with decreased wettability appear to have a marginal increase in h.

Critical to consistent, controlled cooling is the controlled application of the liquid cooling fluid in a desired distribution, flow rate, and velocity. For example, at a low mass flow rate, CHF and h increase with the mass flow rate. However, at a critical mass flow rate, the advantages of increased mass flow are diminished due to pooling and/or due to a transition to single phase heat transfer. Thus, a spray cooling system is preferably operated uniformly at a mass flow rate defined at a point before the critical mass flow rate is reached. All of these factors make critical the design of the sprayer, i.e., the design of the nozzle and its related spray devices.

Also important to the cooling system design is its operating temperature. In particular, it is desirable to configure the system to operate at a high h, which will occur with a design temperature above the boiling temperature and below a temperature that will dry out the sprayed coolant. The amount of heat to be dissipated must be less than the CHF.

Typically, in implementing a spray cooling system, a spray cooling sprayer is mounted within a container that also contains a printed circuit board carrying one or more chips. The printed circuit board has leads that electrically connect to systems outside of the container via air- and water-tight connections. Such systems can be large, and can be expensive to build and maintain.

Accordingly, there has existed a need for a small, accurate, reliable and cost-efficient spray cooling system that can be used to support complex processing systems having one or more high-dissipation devices. The spray cooling system will preferably offer flexible and redundant operation for maximum reliability, and will operate with precise flow rates for accurate control. Preferred embodiments of the present invention satisfy these and other needs, and provide further related advantages.

SUMMARY OF THE INVENTION

In various embodiments, the present invention solves some or all of the needs mentioned above by providing a package-level cooling system that efficiently operates to provide accurate cooling to a component.

The system for cooling a component such as a semiconductor device with a cooling fluid, of the invention, features a sprayer having an orifice configured to eject a stream of the cooling fluid, and a stream deflector operable to selectively control deflection of the stream between spraying in a first direction and spraying in a second direction. At least one of the directions is an unobstructed direction toward the component. The system may further feature an obstruction such as a gutter configured to obstruct cooling fluid sprayed in one of the directions from striking the component. Alternatively, the system may further feature an incremental sprayer instead of a gutter. Optionally, the system may feature both an incremental sprayer and a gutter.

The stream deflector may operate using a variety of mechanisms, such as a contact surface, controllable orifice heaters, and/or electrodes configured to deflect the stream in one or more degrees of freedom to form a spray pattern. Multiple sprayers may have overlapping spray patterns for redundancy.

Other features and advantages of the invention will become apparent from the following detailed description of the preferred embodiments, taken in conjunction with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

DETAILED DESCRIPTION OF THE PREFERRED EMBODIMENTS

The invention summarized above and defined by the enumerated claims may be better understood by referring to the following detailed description, which should be read in conjunction with the accompanying drawings. This detailed description of particular preferred embodiments of the invention, set out below to enable one to build and use particular implementations of the invention, is not intended to limit the enumerated claims, but rather it is intended to provide particular examples thereof.

Evaporative spray cooling promises to be a technology that can deliver high performance cooling. An objective of spray cooling is for a device's wall-temperature to achieve a value close to a coolant's saturation temperature. For example, a vaporization of low boiling point fluid such as 3M® FC-72, having a boiling point of 56 degrees C. can achieve a chip wall temperature close to 70 degrees C. Such a wall temperature might be necessary to keep a device's junction temperature at 85 C. This need to keep the chip wall temperature at 70 degrees C. stems from the typically irregular distribution of power on a chip. The high power densities, reaching 200 W/cm$^2$, for a 50 W source distributed over 0.5 cm by 0.5 cm, cannot easily be addressed by conventional mechanical interfacing means.

Figure 1:
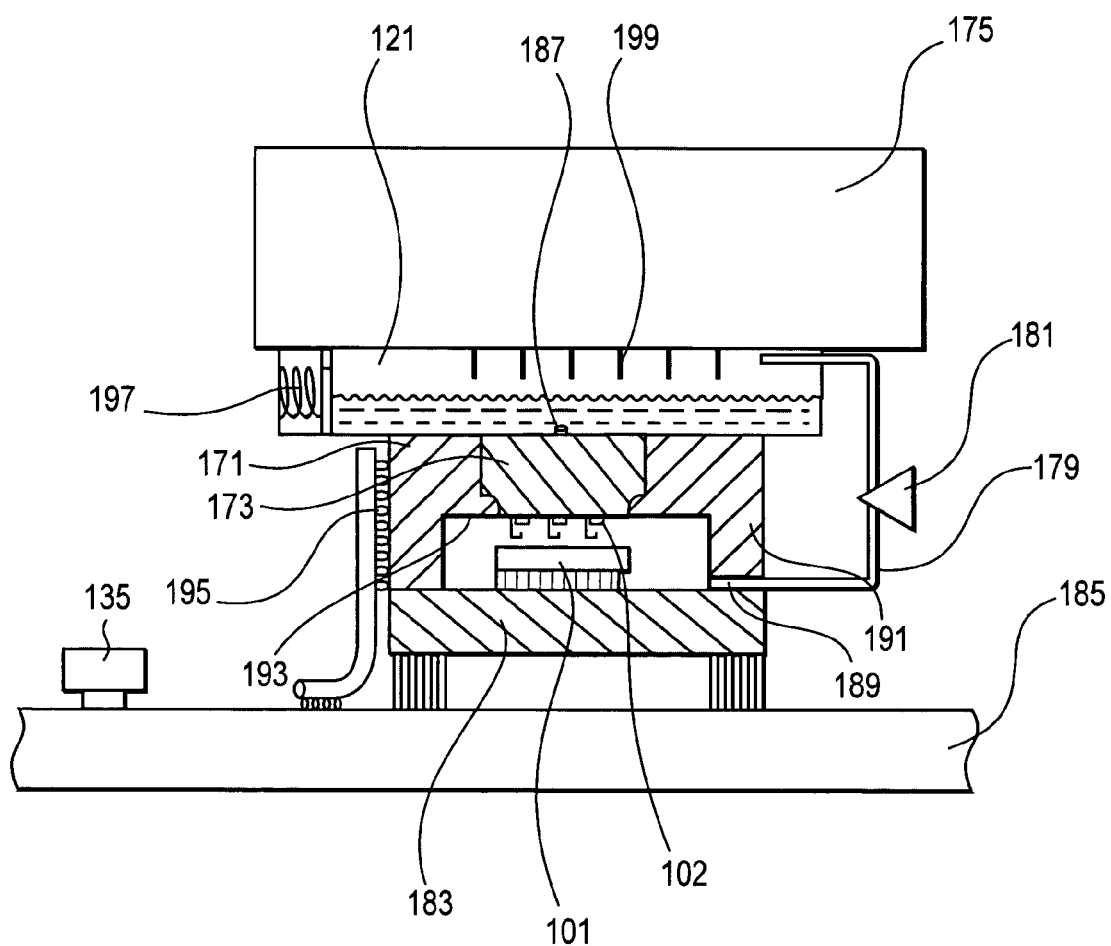
FIG. 1 is a cross-sectional, front view of a first cooling system and a cooled component embodying the invention.
Figure 2:
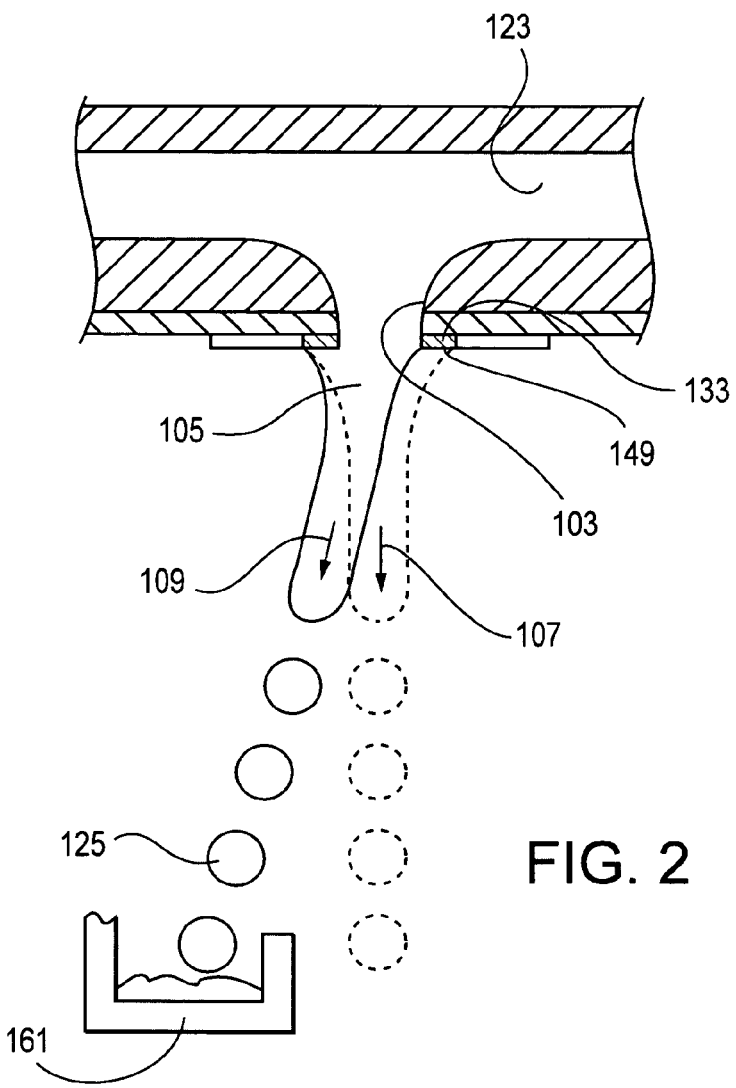
FIG. 2 is a cross-sectional, front view of a sprayer and a gutter of the first cooling system depicted in FIG. 1.
Figure 3:
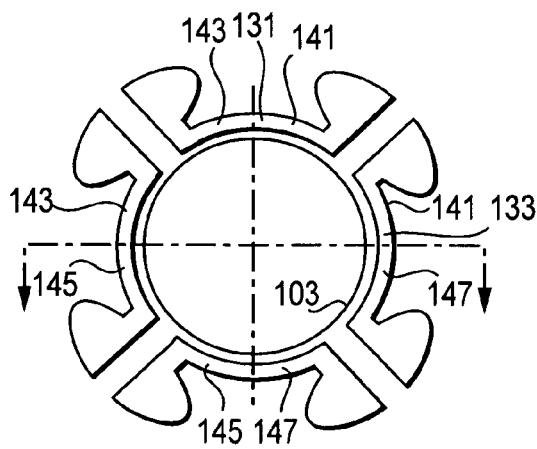
FIG. 3 is a bottom view of an orifice and associated heater segments of the sprayer depicted in FIG. 2.
Figure 4:
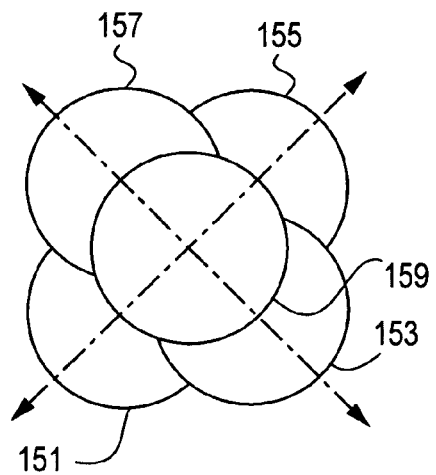
FIG. 4 is a top view of a spray pattern including five spray footprints produced by the sprayer depicted in FIG. 2.

With reference to FIGS. 1-3, the first embodiment of a cooling system is for cooling a component 101, such as a heat-generating semiconductor device, other information processing device, optical component, or the like. The system cools the component by spraying the component with a cooling fluid. The system includes a plurality of sprayers 102, each sprayer having an orifice 103 configured to eject a stream 105 of the cooling fluid. The system also includes a stream deflector operable to selectively control deflection of the stream between spraying in an undeflected direction 107 and spraying in a deflected direction 109, where the undeflected direction is preferably in an unobstructed direction toward the component. The deflector is preferably integrated into the silicon of the sprayer using standard MEMs manufacturing precesses.

The sprayers are provided with cooling fluid from a reservoir 121 containing pressurized cooling fluid. The reservoir is in fluid communication with a cooling fluid channel 123. The channel is provided with periodic openings that form the orifices 103, one orifice being associated with each sprayer. To create the sprayers, liquid microchannels are fabricated into a silicon wafer using standard wafer processing methods. Under pressure from the reservoir, cooling fluid flows from the reservoir, through the channel, and out through each orifice to form the streams 105 of cooling fluid. Thus, the channel places the sprayer orifice in fluid communication with a source of cooling fluid (the reservoir) adapted to provide cooling fluid to the orifice at a pressure adequate to continuously eject the stream of cooling fluid.

At a distance from the orifice, surface tension forces within the stream of cooling fluid caused the stream to separate into droplets 125, thus changing the stream from a continuous stream into a stream of droplets. This separation distance may be influenced by a number of factors such as fluid properties (e.g., surface tension), and can be determined experimentally or analytically.

At a surface forming an exit plane of a peripheral portion of the orifice, the embodiment includes four heater segments 131, including a first heater segment 133, the four heater segments forming a ring substantially surrounding an exit of the orifice. Each heater segment extends around substantially one quarter of the exit, and is individually energizable. A controller 135 is configured to controllably energize any of the heater segments, and preferably any of four adjacent pairs of heater segments, including a first pair 141, a second pair, 143, a third pair 145 and a fourth pair 147.

During operation of the sprayer, if no heater segment is energized, then the stream sprays in the undeflected direction 107. At such time, surface tension forces draw cooling fluid exiting the orifice to extend across a surface of the peripheral portion of the orifice. A portion of that surface includes an outer edge 149 of the heater segments.

However, when one or more of the heater segments 131 are energized, the cooling fluid recedes from across the energized heater segments, and the surface tension forces do not draw the cooling fluid back across so long as the energized heater segments remain energized. When an asymmetric group of one or more heater segments are energized, the stream is deflected. For example, FIG. 2 depicts the stream 105 being deflected from the undeflected direction 107 to the deflected direction 109 because the controller 135 has energized the first heater segment 133. The heater portions thus form the stream deflector of this embodiment, and the stream deflector includes a heater configured to asymmetrically heat the peripheral portion of the orifice.

With reference to FIGS. 3 and 4, the controller can selectively energize the first pair 141 of heater segments to deflect the stream from the undeflected direction 107, to a first deflected direction that forms a first deflected spray footprint 151. Likewise, the controller can selectively energize the second pair 143 of heater segments to deflect the stream in a second deflected direction that forms a second deflected spray footprint 153, the third pair 145 of heater segments to deflect the stream in a third deflected direction that forms a third deflected spray footprint 155, and the fourth pair 147 of heater segments to deflect the stream in a fourth deflected direction that forms a forth deflected spray footprint 157.

The undeflected direction forms a undeflected spray footprint 159 that is central between the other spray footprints. As is shown in FIG. 4, the use of different, overlapping pairs of heater segments and/or individual heater segments and/or provides the stream deflector to be configured to deflect the stream laterally in two degrees of freedom. It should be noted that the spray footprints for individual heater segments, which is not depicted, would deflect the cooling fluid in directions 45 degrees from those depicted, but the deflection distance from the undeflected stream would be less. For each sprayer, the combination of all footprints that the controller is configured to produce forms a spray pattern.

In alternative embodiments, there could be other numbers of heater segments (e.g., one, two, three, or five or more segments). Also, the full set of segments could fully surround the sprayer opening, or could extend around only a portion. Furthermore, the segments (or the controller) could be configured for only one dimensional deflection, and that deflection could swing the stream either one way or both ways from the undeflected stream.

Returning to the first embodiment with reference to FIG. 2, the stream deflector is configured such that the deflected stream direction 109 directs the stream towards an obstruction configured to obstruct cooling fluid sprayed in the deflected direction from striking the component. The obstruction is preferably a gutter 161 configured to channel cooling fluid away from the component, and to cycle cooling fluid back on a path to the cooling fluid reservoir without coming into contact with the component. Thus, by controllably deflecting the cooling fluid, the flux of the continuous stream 105 onto the component can be controlled with some precision.

While the present embodiment provides a plurality of deflected cooling fluid spray directions, with one or more of the spray directions being directed into the gutter, and with the undeflected direction and one or more deflected directions being directed toward the component without obstruction, other combinations are also within the scope of the invention. For example, an alternative embodiment could be provided with an obstruction configured to obstruct cooling fluid sprayed in the undeflected direction from striking the component.

As previously noted, the cooling system has a plurality of sprayers. Optionally, the plurality of sprayers includes a first sprayer and a second sprayer, each of which has an orifice configured to eject a stream of the cooling fluid. As described above, each sprayer includes a deflector operable to selectively control deflection of its respective sprayer stream between spraying in a first direction and a second direction, at least one of which is unobstructed directions toward the component, i.e., having a footprint on the component. To provide redundancy, flexibility in operation, or additional cooling capability, the first-sprayer first direction and the second-sprayer second direction are both toward a single thermal location on the component. Preferably, each sprayer has at least two different spray locations on the component, not all of witch overlap with the locations of the other sprayer. The controller is configured to control operation of the first and second sprayer's stream deflectors to provide redundancy, flexibility in operation, and/or additional cooling capability by having multiple sprayers' footprints on a given component location. For example, each sprayer could have two footprints on the component, each of which is redundant with that of a different nearby sprayer. To provide additional advantage, sprayers could have overlapping spray locations with a plurality of neighboring sprayers.

As noted above, at a separation distance from the orifice, surface tension forces within the stream of cooling fluid caused the stream to separate into droplets 125. The heater segments of this embodiment (or functionally similar embodiments) may be used to control the distance in which the stream separates into droplets. Such a use is provided by having a heater (being the combination of one or more heater segments that preferably surround the opening) that is configured to heat cooling fluid being emitted by the orifice, and by having the controller configured to cyclically energize the heater to control the distance from the orifice in which the stream breaks into droplets.

With reference again to FIG. 1, the first embodiment preferably includes a cooling cap 171, a spray mechanism 173, the reservoir 121, a heat sink 175, a cooling fluid recovery line 179, and a pump 181. The cap, spray mechanism and reservoir are preferably integrated into a single cooling assembly, some or all of which can be unitary. The cap is configured to form a spray chamber in which cooling fluid can be sprayed into thermal contact with, and preferably onto, one ore more components 101, which are mounted and carried on a component substrate 183, forming a package, which is in turn mounted and carried on a printed circuit board 185.

The spray mechanism 173 includes an inlet 187 for receiving cooling fluid into the channel in a liquid state. An outlet 189 for liquid and gaseous cooling fluid recovery preferably extends from the spray chamber to the cooling fluid recovery line. This cooling assembly preferably provides a fully integrated, module-level spray-cooling system that resides, and operates locally on single or multiple uncovered semiconductor components 101.

Preferably, the cap 171 includes a concave portion having surfaces 193 that form a cavity configured to conformingly adjoin to one or more surfaces of the component substrate 183. When the cavity of the cap conformingly adjoins the component substrate, the spray chamber is formed, containing (or bordering on) at least the portions of the component to be spray cooled. The cap is preferably made of a material having a thermal coefficient of expansion substantially matching that of the component substrate. Preferably, the cap is retained against the component substrate by an adhesive, a clamping mechanism, fasteners, or other attachment-type mechanisms, and a seal is formed such that liquid and vapor cooling fluid do not escape the spray chamber other than through designed orifices.

The flow of cooling fluid is typically controlled in response to control signals, which are sent to the sprayer by the controller 135. This computerized controller is electrically connected to the heater via a plurality of contacts 195, preferably being mounted on the side of the cap with respect to gravity to leave the top open for use by the reservoir. The contacts are preferably integrated in the cap and exposed on its exterior.

As previously noted, this embodiment typically will include a plurality of sprayers, each of which can be run at different rates depending on the heat dissipation requirements of the portion of the component that it sprays. The cooling cap can also be used with a component substrate that caries a variety of different components. One or more sprayers can be associated with each chip, and can be individually controlled to operate at rates that depend on the heat production of each portion of each individual chip.

The reservoir 121 is a container that adjoins and preferably is integral with the cap 171 and/or the sprayer head 173. The reservoir preferably includes a pressure control actuator 197 to maintain the pressure within the reservoir above the pressure within the spray chamber, and preferably above atmospheric pressure. The general flow rate from the sprayers may be varied by varying the pressure in the reservoir. The controller preferably controls the operation of the pressure control actuator to this end. The pressure control actuator can operate using mechanical devices (e.g., springs and/or plungers), pressure driven devices (e.g., air compressors), electrical devices (e.g., piezoelectric devices), or the like. The reservoir is preferably located at or above the level of the sprayer with respect to gravity, so as to avoid gravity degrading the fluid pressure feeding of the sprayers. However, other orientations are also within the scope of the invention.

The reservoir 121 preferably also serves as a condenser. The heat transfer from the condenser to the surrounding, ambient conditions preferably occurs through the heat sink 175, which is an air-cooled heat sink, and is mounted to the condenser (reservoir). The heat sink may also be a liquid cold-plate or a refrigerated cold-plate. Embodiments of the invention preferably provide a fully contained package with high performance spray cooling system that can utilize any heat sink option available.

The reservoir is roughened internally, or includes fins 199 to increase its internal surface area and thus improve its ability to channel heat from the cooling fluid to the heat sink. In alternative embodiments, a separate condenser can be used, where the heat sink adjoins the condenser and a passage exists to transfer cooling fluid from the condenser to the reservoir.

The outlet for cooling fluid recovery 189 is preferably low in the spray chamber with respect to gravity in order to recover liquid cooling fluid, and leads into the cooling fluid recovery line 179. The cooling fluid recovery line passes through the pump 181, which is configured to pump liquid and vapor cooling fluid up the liquid recovery line into the reservoir/condenser 121 at a pressure equal to the pressure maintained by the pressure control actuator 197. The controller preferably controls the operation of the pump to this end. The pump is preferably a micropump, being a low head, low flow pump. For at least some applications, a good choice of pump might be a piezoelectric diaphragm pump that can pump both liquid and vapor. The liquid recovery line preferably expels liquid cooling fluid into the reservoir at a location above the anticipated level of liquid cooling fluid, thereby making it pour or spray through vapor in the reservoir.

Figure 5:
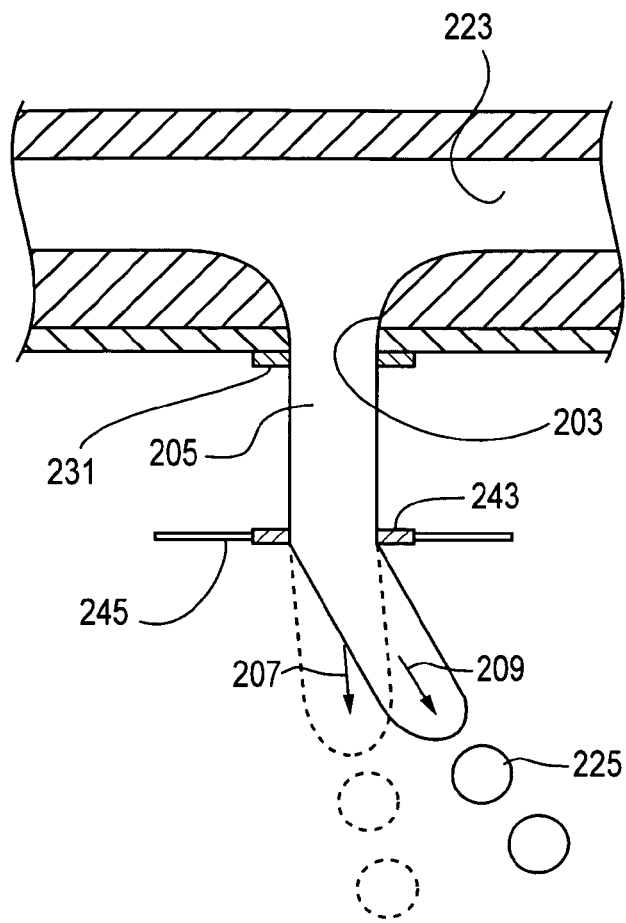
FIG. 5 is a cross-sectional, front view of a sprayer of a second cooling system embodying the invention.
Figure 6:
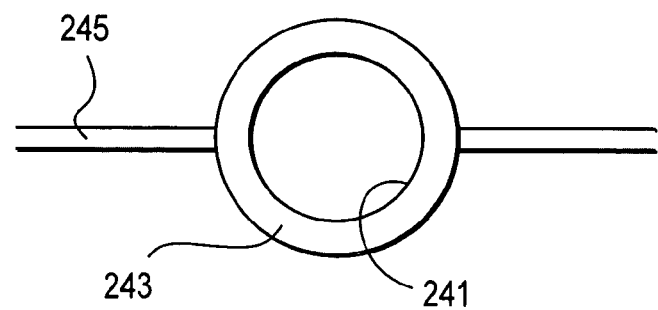
FIG. 6 is a top view of a control ring of the cooling system depicted in FIG. 5.

With reference to FIGS. 5 and 6, a second embodiment of a cooling system is similar to the first embodiment of FIG. 1, but the stream deflector is configured to operate under a different principal. Similar to the first embodiment, the second embodiment is configured for cooling a component, such as a heat-generating semiconductor device, other information processing device, optical component, or the like. The system cools the component by spraying the component with a cooling fluid. The system includes a plurality of sprayers, each sprayer having an orifice 203 configured to eject a stream 205 of the cooling fluid. The system also includes a stream deflector operable to selectively control deflection of the stream between spraying in a first deflected direction 207 and spraying in a second deflected direction 209, where at least one of the two deflected directions is in an unobstructed direction toward the component.

Similar to the first embodiment, the sprayers are provided with cooling fluid from a reservoir containing pressurized cooling fluid. The reservoir is in fluid communication with a cooling fluid channel 223. The channel is provided with periodic openings that form the orifices 203, one orifice being associated with each sprayer. Under pressure from the reservoir, cooling fluid flows from the reservoir, through the channel, and out through each orifice to form the streams 205 of cooling fluid. Thus, the channel places the sprayer orifice in fluid communication with a source of cooling fluid (the reservoir) adapted to provide cooling fluid to the orifice at a pressure adequate to continuously eject the stream of cooling fluid.

At a distance from the orifice, surface tension forces within the stream of cooling fluid caused the stream to separate into droplets 225. This separation distance can be determined experimentally or analytically. Optionally, a heater 231, which may be made of one or more heater segments, may be used to control the distance in which the stream separates into droplets. Similar to the corresponding use in the first embodiment, such a use is provided by having a heater (being the combination of one or more heater segments that preferably surround the opening) that is configured to heat cooling fluid being emitted by the orifice, and by having a controller configured to controllably and cyclically energize the heater to control the distance from the orifice in which the stream breaks into droplets.

Stream deflection is controlled using a control surface placed in preferably continuous contact with the stream at a location where it is a continuous stream, i.e., it has not yet transformed into a stream of droplets. The control surface causes a deflection of the stream with respect to what would be the stream's natural (undeflected) direction. This deflection, which is related to the gain in free energy caused by the contact, may be controlled by controlling the location of the control surface with respect to the stream (i.e., with respect to the portion of the stream that is upstream from the control surface). This control surface location may be adjusted longitudinally along the flow direction of the stream, and/or laterally across the flow direction of the stream. The stream deflector thus includes a moveable control surface configured to contact the stream.

The control surface may be configured to contact the stream around only a portion of the circumference of the stream, or the control surface may extend around and contact the full circumference of the stream, as depicted in FIG. 5. More particularly, the control surface may be a preferably circular inner surface 241 of a control ring 243. The inner surface may be cylindrical, curved along an axial direction, or otherwise shaped as an inner portion of a torus. The location of the ring may be controlled by one or more control arms 245 that are actuated by any of a variety of one or more actuators, the actuators being controllable, such as by signals from the controller.

During operation of the sprayer, the stream sprays in the various deflected directions, which may include a variety of different directions. The selected direction is implemented by the controller by actuating the actuators. The selected directions can provide a multitude of spray footprints, at least one of which is preferably toward an obstruction configured to obstruct cooling fluid from striking the component. The obstruction is preferably a gutter configured to channel cooling fluid away from the component, and to cycle cooling fluid back on a path to the cooling fluid reservoir.

Similar to the first embodiment, the cooling system of the second embodiment has a plurality of sprayers. Optionally, the plurality of sprayers includes a first sprayer and a second sprayer configured to provide redundancy, flexibility in operation, and/or additional cooling capability by each having a spray direction forming a footprint on a single thermal location of the component Preferably, each sprayer has at least two different spray locations on the component, not all of witch overlap with the locations of the other sprayer. The controller is configured to control operation of the first and second sprayer's stream deflectors to provide redundancy, flexibility in operation, and/or additional cooling capability. As with the first embodiment, sprayers could have overlapping spray locations with a plurality of neighboring sprayers to provide additional advantage.

Figure 7:
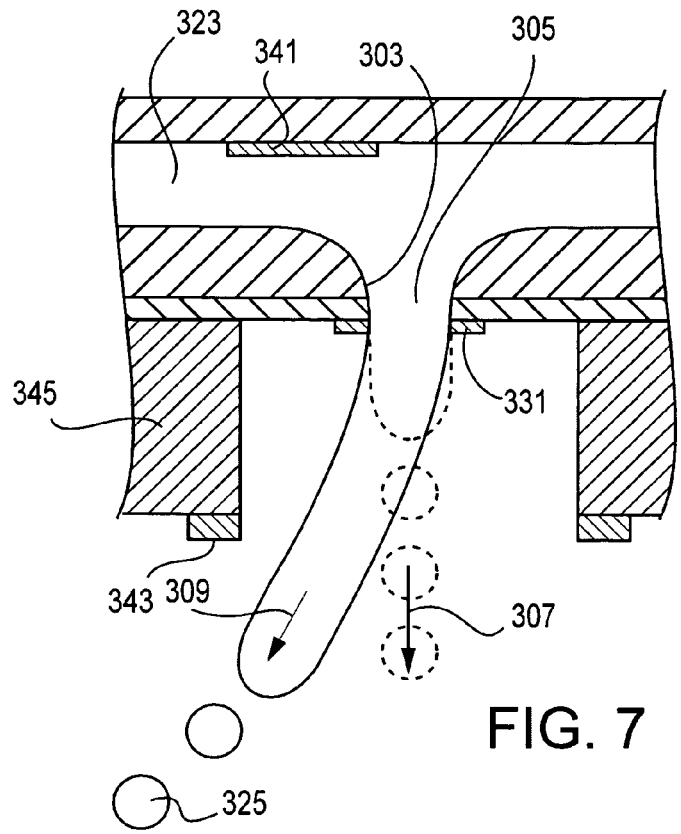
FIG. 7 is a cross-sectional, front view of a sprayer of a third cooling system embodying the invention.
Figure 8:
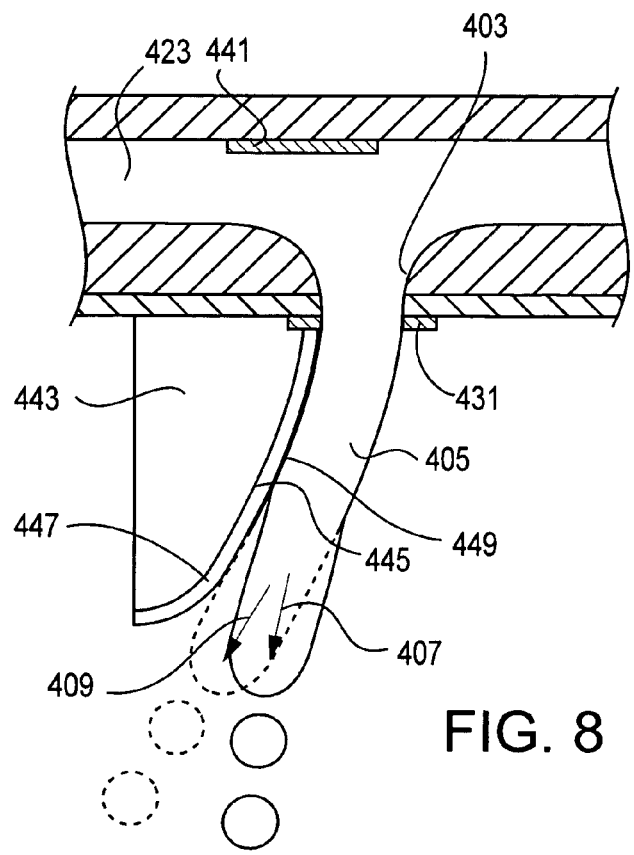
FIG. 8 is a cross-sectional, front view of a sprayer of a fourth cooling system embodying the invention.

With reference to FIG. 7, a third embodiment of a cooling system is similar to the first and second embodiments, but the stream deflector is configured to operate under a different principal. As with the first two embodiments, the third embodiment is configured for cooling a component, such as a heat-generating semiconductor device, other information processing device, optical component, or the like. The system cools the component by spraying the component with a cooling fluid. The system includes a plurality of sprayers, each sprayer having an orifice 303 configured to eject a stream 305 of the cooling fluid. The system also includes a stream deflector operable to selectively control deflection of the stream between spraying in an undeflected direction 307 and spraying in a deflected direction 309, where at least one of these two directions is in an unobstructed direction toward the component.

Similar to the first two embodiments, the sprayers are provided with cooling fluid from a reservoir containing pressurized cooling fluid. The reservoir is in fluid communication with a cooling fluid channel 323. The channel is provided with periodic openings that form the orifices 303, one orifice being associated with each sprayer. Under pressure from the reservoir, cooling fluid flows from the reservoir, through the channel, and out through each orifice to form the streams 305 of cooling fluid. Thus, the channel places the sprayer orifice in fluid communication with a source of cooling fluid (the reservoir) adapted to provide cooling fluid to the orifice at a pressure adequate to continuously eject the stream of cooling fluid.

At a separation distance from the orifice, surface tension forces within the stream of cooling fluid will naturally cause the stream to separate from a continuous stream into a stream of droplets 325. This natural separation distance may be influenced by a number of factors such as fluid properties (e.g., surface tension), and can be determined experimentally or analytically for a given orifice operating at a given pressure. A heater 331, which may be made of one or more heater segments, is used to control the separation distance in which the stream separates into droplets. Similar to the corresponding heater use in the first two embodiments, the heater is configured to heat cooling fluid being emitted by the orifice, and by having a controller configured to controllably and cyclically energize the heater to control and shorten the separation distance from the orifice in which the stream breaks into droplets. This use of the heater causes droplet separation at a shortened separation distance, as shown in dotted lines in FIG. 7. The shortened separation distance can be experimentally established for given configurations of the heater and the controller.

Stream deflection is controlled using the heater 331, and using two or more electrodes. A first electrode 341 is in electrical communication with the cooling fluid in the cooling fluid channel 323. In this embodiment, the cooling fluid conducts electricity, and thus the first electrode is in electrical communication with the stream 305. It should be noted that conductive cooling fluid might not be useful in cooling applications where conductive cooling fluid might interfere with electronic operation of the cooled component. To avoid such interference, a thermally conductive lid or other such thermally conductive barrier may be used to electrically insulate the component. The highly conductive lid could, for example, be made from a diamond impregnated material, and serve as a thermally conductive plate on which the cooling fluid is sprayed.

A second electrode 343 of the two or more electrodes is positioned on a standoff member 345 at a location near the undeflected path of the stream. The standoff member retains the second electrode at a longitudinal standoff distance along the undeflected longitudinal path of the stream (i.e., the axial stream distance from the orifice), and at a lateral standoff distance (i.e., radial distance) from the undeflected stream.

Circuitry is provided to establish an electrical potential between the first and second electrodes, the potential preferably being under the control of the controller. The longitudinal and lateral standoff distances are established at levels appropriate to provide for the stream deflector to function.

More particularly, the stream's natural separation distance is preferably as great or greater than the longitudinal standoff distance, and the shortened separation distance is preferably less than the longitudinal standoff distance. Also, the lateral standoff distance is small enough for the electrical potential between the stream and the second electrode to functionally deflect the stream (e.g., to deflect the stream adequately for the functions described herein) when the stream is undeflected and not shortened by the heater. Preferably, the lateral standoff distance is large enough to prevent the deflected stream from contacting the second electrode when the electrodes are at the full potential provided under the control of the controller.

To control deflection, the heater 331 is used to control the separation distance. When deflection is not desired, the heater is energized to shorten the continuous stream to the shortened separation distance. At that separation distance, the distance between the second electrode and the undeflected, continuous stream is substantially larger than the lateral standoff distance, and is large enough such that the potential difference between the continuous stream and the second electrode is not significant enough to functionally deflect the stream. The limited charge in the related stream of droplets is preferably not adequate for the potential difference to functionally deflect the stream.

When deflection is desired, the heater is not energized, and the continuous stream lengthens to the natural separation distance. At that separation distance, the distance between the second electrode and the undeflected, continuous stream is substantially equal to the lateral standoff distance, and is small enough such that the potential difference between the continuous stream and the second electrode is significant enough to functionally deflect the stream. For an alternative form of control, the controller could control the potential difference between the electrodes, while leaving the continuous stream at a constant length (preferably the natural separation distance).

Optionally, there may be a plurality of standoff electrodes on one or more standoffs, each of which (or groups of which) are configured to function as the second electrode for stream deflection in different directions. Using the first electrode and these standoff electrodes, the controller can selectively energize the standoff electrodes to control the deflection of the stream in a plurality of directions.

Thus, during operation of the sprayer, the stream sprays in the various deflected directions, which may include a variety of different directions. The selected direction is implemented by the controller by selectively energizing the standoff electrodes along with the first electrode (i.e., the stream electrode). The selected directions can provide a multitude of spray footprints, at least one of which is preferably toward an obstruction configured to obstruct cooling fluid from striking the component. The obstruction is preferably a gutter configured to channel cooling fluid away from the component, and to cycle cooling fluid back on a path to the cooling fluid reservoir.

Similar to the first two embodiments, the third embodiment of the cooling system preferably has a plurality of sprayers. Optionally, the plurality of sprayers includes a first sprayer and a second sprayer configured to provide redundancy, flexibility in operation, and/or additional cooling capability by each having a spray direction toward a single thermal location on the component. Preferably, each sprayer has at least two different spray locations on the component, not all of witch overlap with the locations of the other sprayer. The controller is configured to control operation of the first and second sprayer's stream deflectors to provide the redundancy, flexibility in operation, or additional cooling capability. As with the first two embodiments, sprayers could have overlapping spray locations with a plurality of neighboring sprayers to provide additional redundancy.

With reference to FIG. 8, a fourth embodiment of a cooling system is similar to the first through third embodiments, but the stream deflector is configured to operate under principals similar to a combination of the second and third embodiments. As with the first three embodiments, the fourth embodiment is configured for cooling a component, such as a heat-generating semiconductor device, other information processing device, optical component, or the like. The system cools the component by spraying the component with a cooling fluid. The system includes a plurality of sprayers, each sprayer having an orifice 403 configured to eject a stream 405 of the cooling fluid. The system also includes a stream deflector operable to selectively control deflection of the stream between spraying in a first deflected direction 407 and spraying in a second deflected direction 409, where at least one of these two directions is in an unobstructed direction toward the component.

As in the first three embodiments, the sprayers are provided with cooling fluid from a reservoir containing pressurized cooling fluid. The reservoir is in fluid communication with a cooling fluid channel 423. The channel is provided with periodic openings that form the orifices 403, one orifice being associated with each sprayer. Under pressure from the reservoir, cooling fluid flows from the reservoir, through the channel, and out through each orifice to form the streams 405 of cooling fluid. Thus, the channel places the sprayer orifice in fluid communication with a source of cooling fluid (the reservoir) adapted to provide cooling fluid to the orifice at a pressure adequate to continuously eject the stream of cooling fluid.

At a separation distance from the orifice, surface tension forces within the stream of cooling fluid will naturally cause the stream to separate from a continuous stream into a stream of droplets. This natural separation distance may be influenced by a number of factors such as fluid properties (e.g., surface tension), and can be determined experimentally or analytically for a given orifice operating at a given pressure. A heater 431, which may be made of one or more heater segments, is used to control the separation distance in which the stream separates into droplets. Similar to the corresponding heater use in the first three embodiments, the heater is configured to heat cooling fluid being emitted by the orifice, and by having a controller configured to controllably and cyclically energize the heater to control and shorten the separation distance from the orifice in which the stream breaks into droplets. This use of the heater causes droplet separation at a shortened separation distance. The shortened separation distance can be experimentally established for given configurations of the heater and the controller.

Stream deflection is controlled using a control surface and two or more electrodes. A first electrode 441 is in electrical communication with the cooling fluid in the cooling fluid channel 423. In this embodiment, the cooling fluid conducts electricity, and thus the first electrode is in electrical communication with the stream 405. As in the case of the third embodiment, it should be noted that conductive cooling fluid might not be useful in cooling applications where conductive cooling fluid might interfere with the electronic operation of the cooled component. To avoid such interference, a thermally conductive lid or other such thermally conductive barrier may be used to electrically insulate the component. The highly conductive lid could, for example, be made from a diamond impregnated material, and serve as a thermally conductive plate on which the cooling fluid is sprayed.

A second electrode 443 of the two or more electrodes is positioned next to the orifice 403. A guide surface 445 of the second electrode is covered by a covering layer 447 forming a control surface 449. The stream 405 contacts the control surface, preferably at a location adjoining where the stream exits the orifice. The control surface is preferably placed in continuous contact with the stream, and is preferably shaped with a convex curvature along the longitudinal flow direction.

The control surface 449 causes a deflection of the stream with respect to the streams natural (undeflected) direction. This deflection, which is related to the gain in free energy caused by the contact, and could also be influenced by interference with the stream's flow, may be controlled by controlling the location of the control surface with respect to the stream. Optionally, this control surface location may be adjusted longitudinally along the flow direction of the stream, and/or laterally across the flow direction of the stream. The stream deflector thus optionally includes a moveable control surface configured to contact the stream, which is conceptually similar to that of the second embodiment.

The covering layer 447 is composed of an electrically insulating material that prevents the flow of electricity between the stream 405 and the second electrode 443. The covering layer is preferably thin (e.g., a thin coating), to allow the potential between the stream and the second electrode to sufficiently alter the surface free energy and thereby divert the stream, while using a relatively low potential level.

To control deflection, the potential between the stream and the second electrode is adjusted. When a minimum of deflection is desired, the potential is reduced to zero, or a low level. When a larger deflection is desired, the potential is increased.

Figure 9:
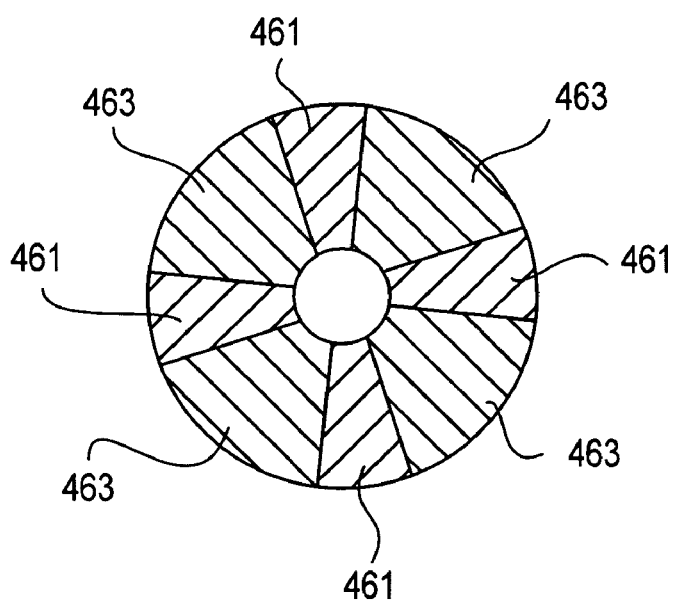
FIG. 9 is a bottom view of a guide surface that underlies a control surface of a variation of the cooling system depicted in FIG. 8.

With reference to FIG. 9, there may optionally be a plurality of electrodes 461, each separated from one another by insulators 463, and each configured to operate as the second electrode. These electrodes and insulators may be configured in rotationally symmetric positions around the orifice to create a rotationally symmetric guide surface. In this arrangement, the control surface covers both the plurality of electrodes and the insulators such that the contact surface preferably becomes a three-dimensional, rotationally symmetric, curved, conical surface. By controlling both the selection of which electrode acts as the second electrode, and the potential of the second electrode, the stream may be controllably diverted by a controlled amount in any of a plurality of directions.

The selected directions can provide a multitude of spray footprints, at least one of which is preferably toward an obstruction configured to obstruct cooling fluid from striking the component. The obstruction is preferably a gutter configured to channel cooling fluid away from the component, and to cycle cooling fluid back on a path to the cooling fluid reservoir.

Similar to the first three embodiments, the fourth embodiment of the cooling system has a plurality of sprayers. Optionally, the plurality of sprayers includes a first sprayer and a second sprayer configured to provide redundancy, flexibility in operation, and/or additional cooling capability by each having a spray direction toward a single thermal location on the component. Preferably, each sprayer has at least two different spray locations on the component, not all of witch overlap with the locations of the other sprayer. The controller is configured to control operation of the first and second sprayer's stream deflectors to provide redundancy, flexibility in operation, and/or additional cooling capability. As with the first two embodiments, sprayers could have overlapping spray locations with a plurality of neighboring sprayers to provide additional redundancy.

Figure 10:
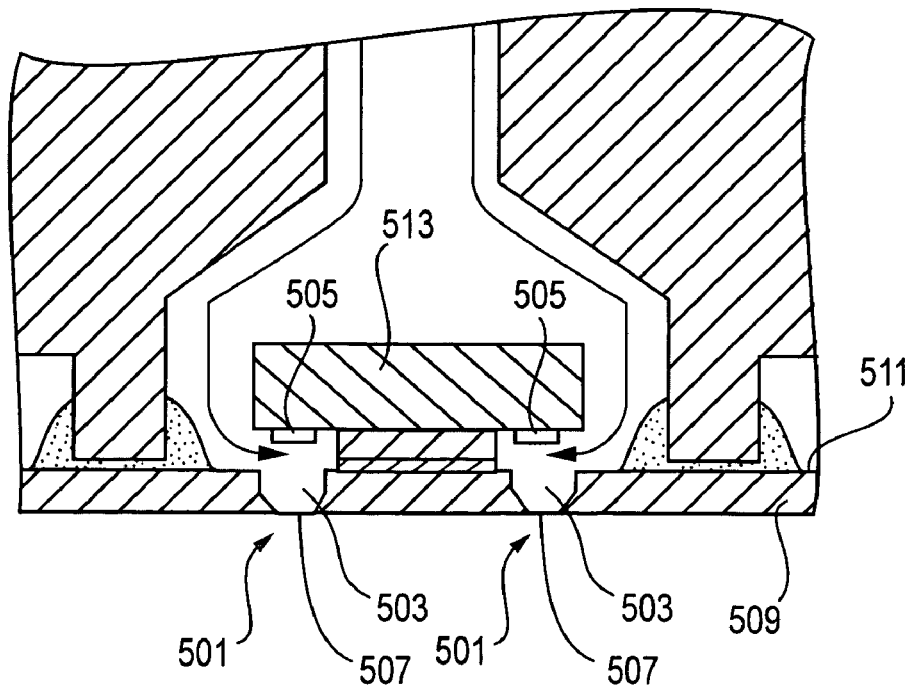
FIG. 10 is a cross-sectional view of an incremental sprayer, as used in a fifth, sixth, seventh and eighth embodiment of the invention.

Each of a fifth, sixth, seventh and eighth embodiment of the invention is respectively similar to the first through fourth embodiments, but uses an incremental sprayer. With reference to FIG. 10, such an incremental sprayer 501 is configured for spraying an incremental amount of a liquid cooling fluid from the reservoir onto the component to evaporatively cool the component. More particularly, FIG. 10 depicts two simplified, exemplary incremental sprayers, each sprayer including structure defining a chamber 503 for receiving a predetermined quantity of the cooling fluid and a heater 505 for vaporizing a portion of the cooling fluid. The vaporized cooling fluid creates pressure to eject an incremental stream of the cooling fluid through an orifice 507 that directs the ejected cooling fluid toward the component. The orifices are preferably formed in a flexible polymer tape 509, e.g., tape commercially available as Kapton™ tape, from 3M Corporation.

Affixed to a back surface 511 of the tape 509 is a silicon substrate 513 containing the heaters 505, in the form of individually energizable thin-film resistors. Each heater is preferably located on a side of the chamber 503 across from the chamber's orifice 507. Cooling fluid is preferably drawn and loaded into the chamber by capillary action, as is typical for an ink-jet type device. A computerized controller (not shown) sends a control signal that energizes the heater, vaporizing the portion of the cooling fluid adjacent to the heater. The vaporized cooling fluid expands, expelling most of the non-vaporized cooling fluid in a stream out of the orifice. After the chamber has been fired by the heater, capillary action again loads the chamber for a subsequent firing.

The flux of liquid spray from the incremental sprayers 501 is highly controllable, and therefore no gutter is needed to catch diverted excess spray. For example, by increasing or decreasing the frequency that the sprayers are energized, the flow rate can be accurately adjusted. Because no gutter is required, the stream deflector can be more completely used to deflect in a variety of directions. Furthermore, because the sprayers can be configured to deliver very small quantities of cooling fluid, and because a large number of sprayers can be fit into a small area, the heat distribution over that area can be accurately controlled by energizing some of the sprayers at a rate greater than that of others.

While the incremental sprayers that can be used as part of the present invention can be based on other types of spray-jet droplet expelling technology, such as piezoelectric technology (i.e., piezoelectric nozzles), they are preferably based on thermal spray-jet technology. Examples of this technology are discussed in numerous U.S. patents, including U.S. Pat. Nos. 5,924,198, 4,500,895, and 4,683,481, which are incorporated herein by reference. Other thermal spray-jet technologies can likewise be appropriate for use with this invention. A highly preferable cooling fluid for use with a thermal incremental sprayer is 3M Fluorinert®, which is easily adaptable to existing thermal spray-jet technology because it has a viscosity and boiling point similar to that of the inks typically used in ink-jet printers.

In the fifth embodiment, at a surface forming an exit plane at a peripheral portion of the orifice, the embodiment includes four heater segments forming a ring substantially surrounding an exit of the orifice. Each heater segment extends around substantially one quarter of the exit, and is individually energizable. A controller is configured to controllably energize any of the heater segments, and preferably any of four adjacent pairs of heater segments. Similar to the first embodiment, if no heater segment is energized during operation of the sprayer, then the stream sprays in an undeflected direction. However, similar to the first embodiment, when an asymmetric group of one or more heater segments are energized, the stream is deflected. The heater portions thus form the stream deflector of this embodiment, and the stream deflector includes a heater configured to asymmetrically heat the peripheral portion of the orifice.

In the sixth embodiment, stream deflection is controlled using a control surface placed in contact with the stream at a location where it is a continuous stream, i.e., where it has not yet transformed into a stream of droplets. The control surface causes a deflection of the stream with respect to the streams natural (undeflected) direction. This deflection, which is related to the gain in free energy caused by the contact, may be controlled by controlling the location of the control surface with respect to the stream (i.e., with respect to the portion of the stream that is upstream from the control surface). This control surface location may be adjusted longitudinally along the flow direction of the stream, and/or laterally across the flow direction of the stream. The stream deflector thus includes a moveable control surface configured to contact the stream. The control surface can by in a variety of configurations, and can be a toroidal-shaped control surface positioned adjacent to the undeflected incremental stream.

In the seventh embodiment, the cooling fluid conducts electricity, and stream deflection is controlled using two or more electrodes. A first electrode is in electrical communication with the cooling fluid exiting the orifice. This can be accomplished using an electrode at the orifice itself. A second electrode of the two or more electrodes is positioned on a standoff member at a location near the undeflected path of the stream. The standoff member retains the second electrode at a longitudinal standoff distance along the undeflected longitudinal path of the stream (i.e., the longitudinal distance from the orifice), and at a lateral standoff distance from the undeflected stream. Circuitry is provided to establish an electrical potential between the first and second electrodes, the potential preferably being under the control of the controller. The longitudinal and lateral standoff distances are established at levels appropriate to provide for the stream deflector to function.

As previously noted, conductive cooling fluid might not be useful in cooling applications where conductive cooling fluid might interfere with electronic operation of the cooled component. To avoid such interference, a thermally conductive lid or other such thermally conductive barrier may be used to electrically insulate the component. The highly conductive lid could, for example, be made from a diamond impregnated material, and serve as a thermally conductive plate on which the cooling fluid is sprayed.

In the eighth embodiment, the cooling fluid conducts electricity, and stream deflection is controlled using a control surface and two or more electrodes. A first electrode is in electrical communication with the cooling fluid exiting the orifice, or using a conductive portion of the control surface. A second electrode of the two or more electrodes is positioned next to the orifice. A guide surface of the second electrode is covered by a covering layer forming the control surface. The stream exiting the orifice contacts the control surface, preferably at a location adjoining where the stream exits the orifice. The control surface is preferably placed in continuous contact with the stream, and is preferably shaped with a convex curvature along the longitudinal flow direction.

The control surface causes a deflection of the stream with respect to the streams natural (undeflected) direction. This deflection, which is related to the gain in free energy caused by the contact, and could also be influenced by interference with the stream's flow, may be controlled by controlling the location of the control surface with respect to the stream. Optionally, this control surface location may be adjusted longitudinally along the flow direction of the stream, and/or laterally across the flow direction of the stream. The stream deflector thus optionally includes a moveable control surface configured to contact the stream, which is conceptually similar to that of the second embodiment.

The covering layer is composed of an electrically insulating material that prevents the flow of electricity between the stream and the second electrode. The covering layer is preferably thin (e.g., a thin coating), to allow the potential between the stream and the second electrode to sufficiently alter the surface free energy and thereby divert the streams, while using a relatively low potential level. To control deflection, the potential between the stream and the second electrode is adjusted. When a minimum of deflection is desired, the potential is reduced to zero, or a low level. When a larger deflection is desired, the potential is increased.

As previously noted, conductive cooling fluid might not be useful in cooling applications where conductive cooling fluid might interfere with the electronic operation of the cooled component. To avoid such interference, a thermally conductive lid or other such thermally conductive barrier may be used to electrically insulate the component. The highly conductive lid could, for example, be made from a diamond impregnated material, and serve as a thermally conductive plate on which the cooling fluid is sprayed.

As with the first four embodiments, the incremental spray-cooler of the fifth through eighth embodiments can include a controller configured to control a distance from the orifice in which the incremental streams break into droplets by cyclically energizing a heater. They also preferably are configured with multiple such sprayers wherein nearby sprayers have spray patterns that allow for one or more spray footprints from each sprayer to overlap on a single thermal location of the component.

It is to be understood that the invention comprises apparatus and methods for designing cooling systems and for producing cooling systems, as well as the apparatus and methods of the cooling system itself. Additionally, the various embodiments of the invention can incorporate various combinations of the features disclosed above in generally discussing an spray-jet spray cooling system, and can be designed, made and operated using related methods (or portions thereof) as described above for the spray-jet spray cooling system. In short, the above disclosed features can be combined in a wide variety of configurations within the anticipated scope of the invention.

Furthermore, it is to be understood that cooled components, cooled singly or in groups as described above, can be mounted on circuit boards to form systems including one or more circuit boards carrying one or more cooled components that are electronically interlinked via the circuit boards. Such systems are also within the scope of the invention. Additionally, groups of the cooled components combined with one or more cooling fluid condensers that cool fluid from numerous cooled components are also within the scope of the invention.

While particular forms of the invention have been illustrated and described, it will be apparent that various modifications can be made without departing from the spirit and scope of the invention. Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

What is claimed is:

1. A system for cooling a component with a cooling fluid, comprising:
   a sprayer having an orifice configured to eject a stream of the cooling fluid; and
   a stream deflector operable to selectively control deflection of the stream between spraying in a first direction and spraying in a second direction;
   wherein the first direction is an unobstructed direction toward the component.

2. The system of claim 1, and further comprising an obstruction configured to obstruct cooling fluid sprayed in the second direction from striking the component; wherein the sprayer is configured to eject the stream in the first direction without deflection by the stream deflector.

3. The system of claim 1, and further comprising an obstruction configured to obstruct cooling fluid sprayed in the second direction from striking the component; wherein the sprayer is configured to eject the stream in the second direction without deflection by the stream deflector.

4. The system of claim 1, wherein the stream deflector is configured to deflect the stream in two degrees of freedom.

5. The system of claim 1, and further comprising:
   a second sprayer having an orifice configured to eject a stream of the cooling fluid;
   a second stream deflector operable to selectively control deflection of the second-sprayer stream between spraying in a second-sprayer first direction and a second-sprayer second direction; and
   a controller configured to control operation of the first and second stream deflectors;
   wherein the second-sprayer first and second directions are unobstructed directions toward the component; and
   wherein the first-sprayer first direction and the second-sprayer second direction are both toward a single thermal location on the component.

6. The system of claim 1, and further comprising:
   a heater configured to heat cooling fluid being emitted by the orifice; and
   a controller configured to control a distance from the orifice in which the stream breaks into droplets by cyclically energizing the heater.

7. The system of claim 1, wherein the sprayer orifice is in fluid communication with a source of cooling fluid adapted to provide cooling fluid to the orifice at a pressure adequate to continuously eject the stream of cooling fluid.

8. The system of claim 7, wherein the stream deflector includes a heater configured to asymmetrically heat a peripheral portion of the orifice.

9. The system of claim 8, and further comprising an obstruction configured to obstruct cooling fluid sprayed in the second direction from striking the component.

10. The system of claim 8, and further comprising a controller configured to control a distance from the orifice in which the stream breaks into droplets by cyclically energizing the heater.

11. The system of claim 8, and further comprising:
    a second sprayer having an orifice configured to eject a stream of the cooling fluid;
    a second stream deflector operable to selectively control deflection of the second-sprayer stream between spraying in a second-sprayer first direction and a second-sprayer second direction; and
    a controller configured to control operation of the first and second stream deflectors;
    wherein the second-sprayer first and second directions are unobstructed directions toward the component; and
    wherein the first-sprayer first direction and the second-sprayer second direction are both toward a single thermal location on the component.

12. The system of claim 7, wherein the stream deflector includes a moveable control surface configured to contact the stream.

13. The system of claim 12, wherein the stream deflector includes a torus-shaped inner control surface adjoining the circumference of the stream.

14. The system of claim 12, and further comprising an obstruction configured to obstruct cooling fluid sprayed in the second direction from striking the component.

15. The system of claim 12, and further comprising:
    a heater configured to heat cooling fluid being emitted by the orifice; and
    a controller configured to control a distance from the orifice in which the stream breaks into droplets by cyclically energizing the heater.

16. The system of claim 12, and further comprising:
    a second sprayer having an orifice configured to eject a stream of the cooling fluid;
    a second stream deflector operable to selectively control deflection of the second-sprayer stream between spraying in a second-sprayer first direction and a second-sprayer second direction; and
    a controller configured to control operation of the first and second stream deflectors;
    wherein the second-sprayer first and second directions are unobstructed directions toward the component; and
    wherein the first-sprayer first direction and the second-sprayer second direction are both toward a single thermal location on the component.

17. The system of claim 7, wherein the stream deflector includes a first electrode in contact with the cooling fluid that forms the stream, and a second electrode positioned to deflect the stream when a voltage is applied between the first and second electrodes.

18. The system of claim 17, wherein the second electrode is positioned to actuate a free-flowing portion of the stream.

19. The system of claim 17, and further comprising a body having a surface configured to adjoin the stream and thereby deflect the stream, wherein the second electrode is positioned to affect the interaction between the body and the stream.

20. The system of claim 17, and further comprising an obstruction configured to obstruct cooling fluid sprayed in the second direction from striking the component.

21. The system of claim 17, and further comprising:
    a heater configured to heat cooling fluid being emitted by the orifice; and
    a controller configured to control a distance from the orifice in which the stream breaks into droplets by cyclically energizing the heater.

22. The system of claim 17, and further comprising:
a second sprayer having an orifice configured to eject a stream of the cooling fluid;
a second stream deflector operable to selectively control deflection of the second-sprayer stream between spraying in a second-sprayer first direction and a second-sprayer second direction; and
a controller configured to control operation of the first and second stream deflectors;
wherein the second-sprayer first and second directions are unobstructed directions toward the component; and
wherein the first-sprayer first direction and the second-sprayer second direction are both toward a single thermal location on the component.

23. An incremental spray-cooler, comprising:
a sprayer body having an orifice and having a spray actuator configured to spray incremental streams of cooling fluid in response to a control signal; and
a stream deflector operable to selectively control deflection of the incremental streams between spraying in a first direction and spraying in a second direction.

24. The incremental spray-cooler of claim 23, wherein the stream deflector includes a heater configured to asymmetrically heat a peripheral portion of the orifice.

25. The incremental spray-cooler of claim 24, and further comprising a controller configured to control a distance from the orifice in which the incremental streams break into droplets by cyclically energizing the heater.

26. The incremental spray-cooler of claim 24, and further comprising:
a second sprayer having an orifice configured to eject a stream of the cooling fluid;
a second stream deflector operable to selectively control deflection of the second-sprayer stream between spraying in a second-sprayer first direction and a second-sprayer second direction; and
a controller configured to control operation of the first and second stream deflectors;
wherein the second-sprayer first and second directions are unobstructed directions toward the component; and
wherein the first-sprayer first direction and the second-sprayer second direction are both toward a single thermal location on the component.

27. The incremental spray-cooler of claim 24, wherein:
the sprayer body defines a chamber configured to hold an incremental volume of the cooling fluid; and
the sprayer body includes a heating element in thermal communication with the chamber, the heating element being configured to vaporize portions of the cooling fluid held within the chamber to spray the incremental streams of cooling fluid.

28. The incremental spray-cooler of claim 23, wherein the stream deflector includes a moveable control surface configured to contact the incremental streams.

29. The incremental spray-cooler of claim 28, wherein the stream deflector includes a toroidal-shaped control surface positioned adjacent to the undeflected incremental stream.

30. The incremental spray-cooler of claim 28, and further comprising:
a heater configured to heat cooling fluid being emitted by the orifice; and
a controller configured to control a distance from the orifice in which the incremental streams break into droplets by cyclically energizing the heater.

31. The incremental spray-cooler of claim 28, and further comprising:
a second sprayer body having an orifice and having a spray actuator configured to spray incremental streams of cooling fluid in response to a control signal;
a second stream deflector operable to selectively control deflection of the second-sprayer incremental streams between spraying in a second-sprayer first direction and a second-sprayer second direction; and
a controller configured to control operation of the first and second stream deflectors;
wherein the second-sprayer first and second directions are unobstructed directions toward the component; and
wherein the first-sprayer first direction and the second-sprayer second direction are both toward a single thermal location on the component.

32. The incremental spray-cooler of claim 28, wherein:
the sprayer body defines a chamber configured to hold an incremental volume of the cooling fluid; and
the sprayer body includes a heating element in thermal communication with the chamber, the heating element being configured to vaporize portions of the cooling fluid held within the chamber to spray the incremental streams of cooling fluid.

33. The system of claim 23, wherein the stream deflector includes a first electrode in contact with the cooling fluid that forms the stream, and a second electrode positioned to deflect the stream when a voltage is applied between the first and second electrodes.

34. The system of claim 33, wherein the second electrode is positioned to actuate a free-flowing portion of the incremental streams.

35. The system of claim 33, and further comprising a body having a surface configured to adjoin the incremental streams and thereby deflect them, wherein the second electrode is positioned to affect the interaction between the body and the incremental streams.

36. The system of claim 33, and further comprising:
a heater configured to heat cooling fluid being emitted by the orifice; and
a controller configured to control a distance from the orifice in which the incremental streams break into droplets by cyclically energizing the heater.

37. The system of claim 33, and further comprising:
a second sprayer body having an orifice and having a spray actuator configured to spray incremental streams of cooling fluid in response to a control signal;
a second stream deflector operable to selectively control deflection of the second-sprayer incremental streams between spraying in a second-sprayer first direction and a second-sprayer second direction; and
a controller configured to control operation of the first and second stream deflectors;
wherein the second-sprayer first and second directions are unobstructed directions toward the component; and
wherein the first-sprayer first direction and the second-sprayer second direction are both toward a single thermal location on the component.

38. The incremental spray-cooler of claim 24, wherein:
the sprayer body defines a chamber configured to hold an incremental volume of the cooling fluid; and
the sprayer body includes a heating element in thermal communication with the chamber, the heating element being configured to vaporize portions of the cooling fluid held within the chamber to spray the incremental streams of cooling fluid.

* * * * *